(12) United States Patent
Van Helvoort et al.

(10) Patent No.: US 8,754,647 B2
(45) Date of Patent: Jun. 17, 2014

(54) DETUNABLE RF RECEPTION ANTENNA DEVICE

(75) Inventors: Marinus Johannes Adrianus Maria Van Helvoort, Eindhoven (NL); Johannes Den Boef, Eindhoven (NL); Filips Van Liere, Eindhoven (NL); Lambertus De Vries, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 277 days.

(21) Appl. No.: 13/379,665

(22) PCT Filed: Jun. 21, 2010

(86) PCT No.: PCT/IB2010/052795
§ 371 (c)(1),
(2), (4) Date: Dec. 21, 2011

(87) PCT Pub. No.: WO2011/001324
PCT Pub. Date: Jan. 6, 2011

(65) Prior Publication Data
US 2012/0098542 A1  Apr. 26, 2012

(30) Foreign Application Priority Data
Jul. 3, 2009  (EP) .................................... 09164554

(51) Int. Cl.
*G01V 3/00*  (2006.01)
(52) U.S. Cl.
USPC .......................................... 324/322; 324/318
(58) Field of Classification Search
USPC .......................... 324/322, 318, 314, 312, 300
See application file for complete search history.

(56) References Cited

U.S. PATENT DOCUMENTS

| | | | | |
|---|---|---|---|---|
| 4,975,644 A | * | 12/1990 | Fox | 324/318 |
| 5,903,151 A | * | 5/1999 | Potthast | 324/318 |
| 6,160,400 A | * | 12/2000 | Friedrich et al. | 324/322 |
| 6,850,067 B1 | | 2/2005 | Burl et al. | |
| 7,538,554 B2 | * | 5/2009 | Wendt et al. | 324/322 |
| 8,138,762 B2 | * | 3/2012 | Zhu | 324/322 |
| 2002/0145427 A1 | | 10/2002 | Wong et al. | |
| 2013/0241556 A1 | * | 9/2013 | Bollenbeck et al. | 324/322 |

FOREIGN PATENT DOCUMENTS

| | | |
|---|---|---|
| EP | 0615136 B1 | 9/1994 |
| JP | 4224735 A | 8/1992 |
| WO | 2007138547 A2 | 12/2007 |
| WO | 2008001326 A1 | 1/2008 |
| WO | 2008032098 A1 | 3/2008 |
| WO | 2008078270 A1 | 7/2008 |
| WO | 2008155703 A1 | 12/2008 |

OTHER PUBLICATIONS

Galloway, G. J., et al.; In Vivo High-Resolution Volume-Selected Proton Spectroscopy and T1 Measurements in the Dog Brain; 1989; MRM; 9(2)288-295.

* cited by examiner

*Primary Examiner* — Louis Arana

(57) ABSTRACT

The invention relates to a RF reception antenna device (10) for receiving MR signals in a MR imaging system. The device (10) comprises a RF resonant circuit including a RF reception antenna (15) for picking up the MR signals, and a RF amplifier (17) connected at its input to the RF resonant circuit for amplifying the picked up MR signals. The invention proposes to make provision for a detection circuit (18) configured to derive a switching signal from an output signal of the RF amplifier (17). A switching circuit (19) is responsive to the switching signal, wherein the switching circuit (19) is configured to switch the RF resonant circuit between a resonant mode and a non-resonant (i.e. detuned) mode.

10 Claims, 2 Drawing Sheets

DETUNABLE RF RECEPTION ANTENNA DEVICE

FIELD OF THE INVENTION

The invention relates to the field of magnetic resonance (MR) imaging. It concerns a detunable RF reception antenna device for receiving MR signals in a MR imaging system. The invention also relates to a MR device including such a RF reception antenna device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of a pulsed electromagnetic alternating field (RF pulse) of defined frequency (so-called Larmor frequency, or MR frequency). After termination of the RF pulse, a MR signal can be detected by means of a receiving RF antenna (also referred to as receiving coil) which is arranged and oriented within an examination volume of the MR device in such a manner that a temporal variation of the net magnetization of the body of the patient is measured in the direction perpendicular to the z-axis. In order to realize spatial resolution in the body, linear magnetic field gradients extending along the three main axes are superposed on the uniform magnetic field, leading to a linear spatial dependency of the spin resonance frequency. The MR signal picked up by means of the receiving RF antenna then contains components of different frequencies which can be associated with different locations in the body.

Typically, the level of the electromagnetic alternating field during the RF pulse is orders of magnitude larger than the MR signal generated by the excited nuclear spins and detected by the RF receiving antenna. To obtain a maximum signal to noise ratio (SNR) the receiving RF antenna is typically part of a RF resonant circuit configured to resonate at the MR frequency. To maintain safety and to protect the sensitive RF receiving equipment including the reception antenna and the resonant circuit, the RF resonant circuit is usually detuned while RF pulses are irradiated. Known RF reception hardware therefore comprises a switching circuitry which is configured to switch the RF resonance circuit between a resonant mode and a non-resonant mode. MR signal acquisition takes place in the sensitive resonant mode, i.e. during the receive phase of the imaging procedure, while the RF resonant circuit is switched to the non-resonant mode during the transmit phase. In the non-resonant mode the resonance frequency of the RF resonant circuit is shifted away from the MR frequency. In this way, the dangerous induction of high voltages in the RF resonant circuit during the transmit phase is effectively avoided.

Accordingly, it is known to detune the reception circuitry in a MR system by using semiconductor switches or PIN diodes in connection with appropriate LC circuitry. Two principal variants are commonly used (see for example WO 2008/078270 A1), namely active detuning and passive detuning.

With active detuning, a bias voltage is applied to a PIN diode semiconductor switch in conjunction with an LC circuit to detune the RF reception coil during the transmit phase of the imaging procedure. A disadvantage of the active detuning approach is that an external switching signal is needed for switching the RF resonant circuit between the resonant mode and the non-resonant mode. This increases the complexity of the MR imaging system. A further drawback is that, due to the high power of the RF pulses, a correspondingly high bias voltage needs to be applied to the switching diodes to ensure that the receiving circuitry remains decoupled during RF irradiation. This high bias voltage increases design complexity and heat dissipation in the corresponding DC supply lines. Moreover, the current resulting from the high bias voltage induces field distortions in the main magnetic field, thereby degrading image quality.

With passive detuning, anti parallel diode semiconductor switches are used in conjunction with LC circuitry. In this approach, anti parallel combinations of high speed switching diodes detune the RF resonant circuit in response to the RF pulse itself. In other words, when the anti parallel combination of diodes is exposed to the high power signal of the RF pulse, each diode conducts during its respective half cycle of the RF radiation. A major drawback of the passive detuning is that in the case of low flip-angle RF pulses the self-biasing effect of the anti parallel diodes is too small. Consequently, no reliable detuning of the RF resonant circuit during the transmit phase is achieved.

SUMMARY OF THE INVENTION

From the foregoing it is readily appreciated that there is a need for an improved detuning technique. It is consequently an object of the invention to enable reliable detuning of the RF receiving elements during the transmit phase of an MR imaging procedure, wherein no external detuning signal is needed and wherein a reliable detuning is ensured even in the case of low flip-angle RF pulses.

In accordance with the invention, a RF reception antenna device for receiving MR signals in a MR imaging system is disclosed. The device comprises a RF resonant circuit including a RF reception antenna for picking up the MR signals, a RF amplifier connected at its input to the RF resonant circuit for amplifying the picked up MR signals, a detection circuit configured to derive a switching signal from an output signal of the RF amplifier, and a switching circuit responsive to the switching signal, the switching circuit being configured to switch the RF resonant circuit between a resonant mode and a non-resonant mode.

The insight of the invention is that the output signal of the RF amplifier can be used effectively to derive a switching signal for switching the RF resonant circuit between the resonant mode (during the receive phase) and the non-resonant mode (during the transmit phase). No external detune signal generated by the controlling hardware of the used MR device is needed because the switching signal is generated automatically by detection of the RF pulse during the transmit phase. The RF pulse induces a voltage in the RF resonant circuit (even in the non-resonant mode) which is amplified by the RF amplifier. The level of the output signal of the RF amplifier is sufficient to reliably detect the transmit phase of the imaging procedure, even in the case of low flip-angle RF pulses. The response time of the detection circuit is shorter, e.g. by about an order of magnitude, than the rise time of the RF pulse. Thus the invention achieved that the RF resonant circuit is switched into the non-resonant mode is effected before the RF pulse could cause dangerously high voltages. Additionally, the RF reception antenna device of the invention can be provided with a passive detuning circuit that includes anti parallel diode semiconductor switches in conjunction with LC circuitry. Such a passive detuning is known per se e.g. from the international application WO2008/078270.

According to a preferred embodiment of the invention, the RF reception antenna device further comprises an analog-to-digital converter connected directly or indirectly to the output of the RF amplifier, wherein the detection circuit is configured to derive the switching signal from an output signal of the analog-to-digital converter. The detection circuit monitors the output of the analog-to-digital converter and generates the switching signal for switching the RF resonant circuit to the non-resonant mode when the irradiation of a RF pulse is recognized. According to a particularly practical embodiment, the detection circuit is configured to derive the switching signal from an overflow signal of the analog-to-digital converter. In this case the invention makes use of the fact that the RF pulse coupling into the RF resonant circuit overdrives the analog-to-digital converter of the RF reception antenna device. This applies during the complete transmit phase of the MR imaging system, even with the RF resonant circuit switched to the non-resonant mode. An advantage of this embodiment of the invention is that hardly any additional electronic components are required to modify an existing digital RF reception antenna device for operation according to the invention. In the case of RF pulses of particularly low amplitude that do not necessarily overdrive the analog-to-digital converter, the transmit phase can still be detected, namely by means of appropriate digital signal processing. To this end, the RF reception antenna device of the invention preferably comprises a digital signal processor configured to derive the switching signal from the output signal of the analog-to-digital converter.

However, also existing analog RF reception antenna devices can easily be adapted for operation according to the invention by making provision for a comparator connected directly or indirectly to the output of the RF amplifier. In this embodiment, the detection circuit is configured to derive the switching signal from the output signal of the comparator. The comparator generates the switching signal for detuning the RF resonant circuit when the output signal of the RF amplifier exceeds a given transmit level. The transmit level indicates the irradiation of a RF pulse.

According to a preferred embodiment of the invention, the detection circuit exhibits hysteresis. This means, for example, that the RF resonant circuit is switched back from the off-resonant mode to the resonant mode when the output signal of the RF amplifier falls below a given receive level being lower than the transmit level. The level for switching from the resonant to the off-resonant mode and the level for switching back from the off-resonant mode to the resonant mode should differ because the signal level at the output of the RF amplifier drops as soon as the RF resonant circuit is switched to the off-resonant mode after detection of RF pulse irradiation. This signal drop must not result in untimely switching back to the resonant mode. The hysteresis of the detection circuit thus ensures a reliable operation of the detection circuit. As an alternative solution, the detection circuit may be configured such that the RF resonant circuit is switched back from the off-resonant mode to the resonant mode not before the expiration of a predetermined time interval after switching from the resonant mode to the off-resonant mode. Moreover, according to a further preferred embodiment, the detection circuit may be configured to switch the resonant circuit from the resonant mode to the off-resonant mode after a given time interval from the instant at which the output signal of the RF amplifier exceeds the transmit level. Unintended switching due to random signal spikes is avoided in this way.

The RF reception antenna device described thus far can be used for receiving MR signals from a body of a patient positioned in the examination volume of a MR device during a receive phase, the MR device comprising:
 a main magnet for generating a uniform, steady magnetic field within an examination volume,
 a number of gradient coils for generating switched magnetic field gradients in different spatial directions within the examination volume,
 a volume RF coil for generating RF pulses within the examination volume during a transmit phase,
 a control unit for controlling the temporal succession of RF pulses and switched magnetic field gradients, and
 a reconstruction unit for reconstruction of an MR image from the received MR signals.

The RF reception antenna device according to the invention can advantageously be used with most MR devices in clinical use at present. According to a preferred embodiment, the RF reception antenna device is wirelessly connected to the further components of the MR signal reception and processing chain of the MR device. The automatic detuning capabilities of the RF reception antenna device according to the invention are particularly advantageous in applications in which the detected MR signals are transferred to the signal processing and reconstruction hardware of the MR device by means of wireless digital transfer. This is because wireless communication between the different components of the MR examination system is not reliable enough to provide an external detune signal issued by the system controller of the MR device to the RF reception antenna device. However, a wired electrical or optical connection lies also within the scope of the invention.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EMBODIMENTS

Figure 1:
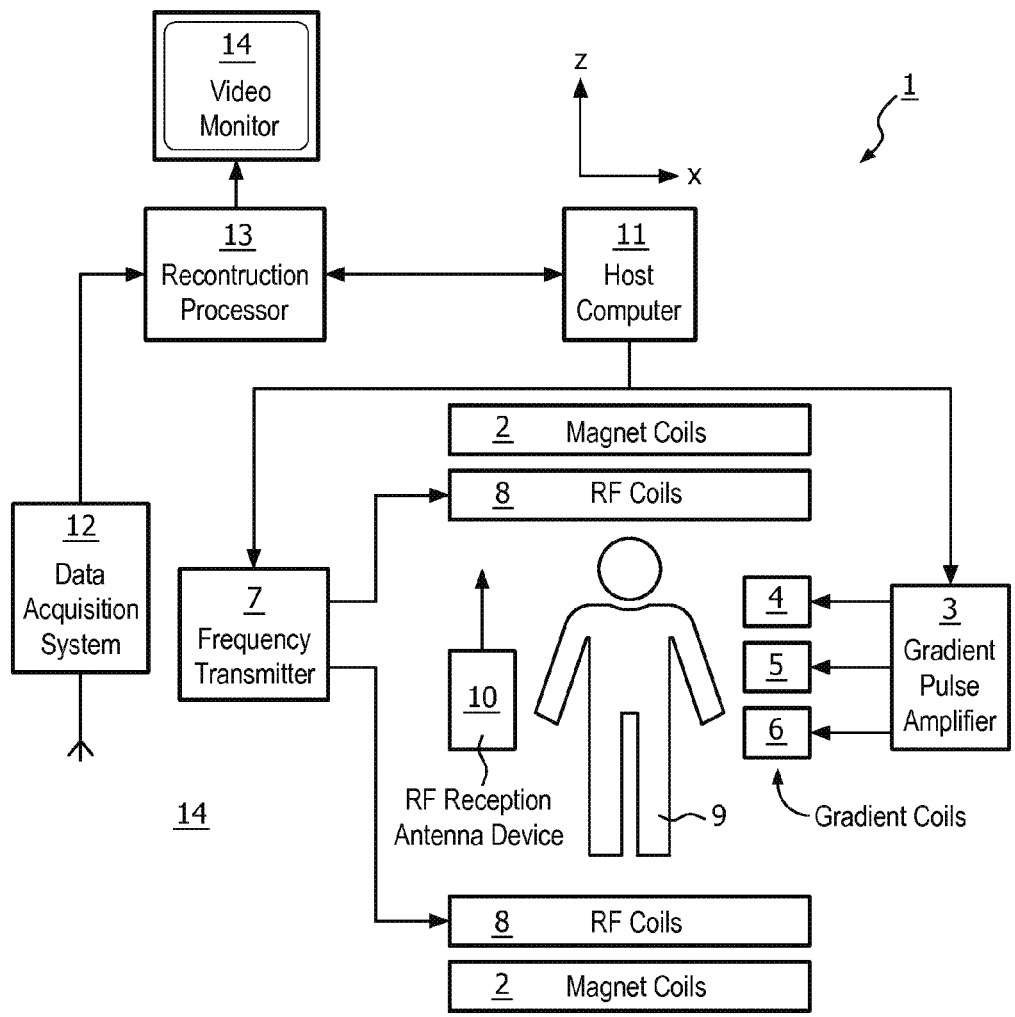
FIG. 1 shows a MR device according to the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. During a transmit phase of a MR imaging procedure a digital RF frequency transmitter 7 transmits RF pulses or pulse packets to a whole-body volume RF coil 8 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 9 positioned in the examination volume.

For generation of MR images of limited regions of the body 9, a local RF reception antenna device 10 is placed contiguous to the region selected for imaging. The device 10 is used to receive MR signals induced by body-coil RF transmissions. The resultant MR signals are picked up, amplified, demodulated and digitized by the RF reception antenna device 10 during a receive phase of the imaging procedure.

A host computer 11 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the RF reception antenna device 10 receives a single or a plurality of MR data lines in rapid succession following each RF excitation pulse. The device 10 is connected via a wireless digital data link to a data acquisition system 12 which converts each MR data line to a digital format suitable for further processing. The data acquisition system 12 is a separate computer which is specialized in acquisition of raw image data.

Ultimately, the digital raw image data is reconstructed into an image representation by a reconstruction processor 13 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 14 which provides a man-readable display of the resultant MR image.

Figure 2:
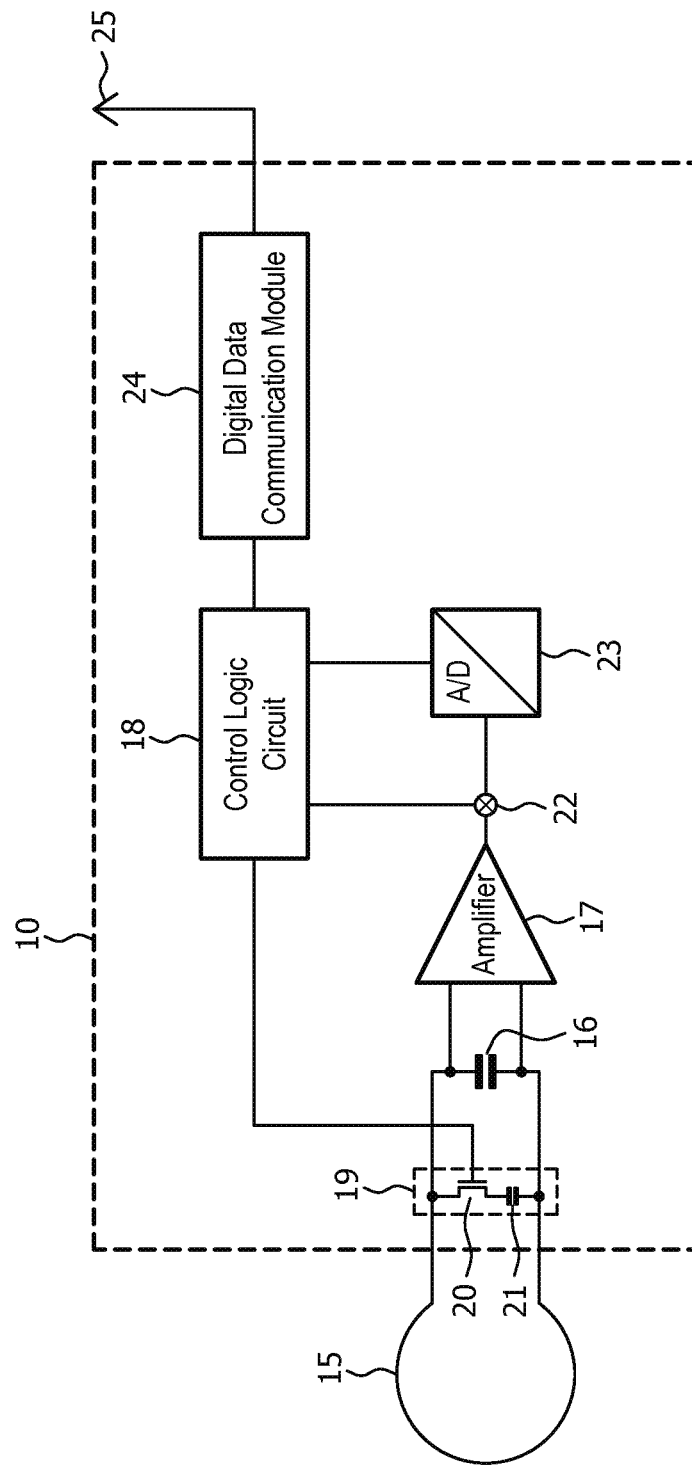
FIG. 2 shows a wireless RF reception antenna device according to the invention.

With reference to FIG. 2, the MR reception antenna device 10 is described in more detail. The device 10 comprises a RF resonant circuit including a RF reception antenna 15 in the form of a single closed loop coil. The antenna 15 is connected to a capacitor 16 such that the antenna 15 and the capacitor 16 form a LC circuit. A RF amplifier 17 is connected at its input to the RF resonant circuit formed by the antenna 15 and the capacitor 16. The RF amplifier 17 amplifies the MR signals picked up by the antenna 15. The RF reception antenna device 10 further comprises a control logic circuit 18 which provides a switching signal to a switching circuit 19. The switching circuit 19 comprises an electronic switch 20 and a capacitor 21 which is connected in parallel to the capacitor 16 of the RF resonant circuit. By activating the switch 20, the RF resonant circuit is switched from a resonant mode, in which the RF resonant circuit resonates at the MR frequency, to a non-resonant (i.e. detuned) mode, in which the resonance frequency of the RF resonant circuit now formed by the coil 15 and the capacitors 16 and 21, is shifted away from the MR resonance frequency. A RF mixer 22 transforms the MR signal picked up by the RF antenna 15 to a lower frequency by mixing the signals with a RF signal supplied by the control logic circuit 18. The mixing provides a lower frequency output signal, which is then digitized by an analog-to-digital converter 23. (A direct analog-to-digital conversion, i.e. without frequency down-conversion, is of course also feasible.) The output signal of the analog-to-digital converter 23 is provided to the control logic circuit 18 constituting a detection circuit within the meaning of the invention. The control logic circuit 18 derives the switching signal provided to the switching circuit 19 from the output signal of the analog-to-digital converter 23. The control logic circuit 18 switches the RF resonant circuit to the non-resonant mode as soon as the output signal of the analog-to-digital converter exceeds a given transmit level. The switching signal is preferably derived from an overflow signal of the analog-to-digital converter 23 provided to the digital control circuit 18. The overflow signal indicates a RF pulse coupling into the RF resonant circuit because the analog-to-digital converter is immediately overdriven by the signal resulting at the output of the RF amplifier 17. A suitable digital data processing algorithm may be implemented in the control logic circuit 18 such that the RF resonant circuit is switched back from the off-resonant mode to the resonant mode when the output signal of the analog-to-digital converter 23 falls below a given receive level indicating the beginning of the receive phase. The control logic circuit 18 is connected to a wireless digital data communication module 24 which transfers the digitized MR signals via antenna 25 to the data acquisition system 12 of the MR device 1 (see FIG. 1).

For example, the amplifier 17 may have a bandwidth of 1 GHz and an so that the effective response time of the amplifier 17 is about 10-20 ns. The analog-to-digital converter 23 operates e.g. at a frequency of 50 MHz, and has an inherent delay of about 100 ns. Further, the control logic has a response time of about one clock cycle of the analog-to-digital converter, i.e. about 20 ns. Accordingly, depending on the values of the parameters of the components of the device 10, an overall response time to switch the RF resonant circuit to a detuned state is about 140 ns-250 ns. Usually, the rise time of the transmit RF pulses is about 2 µs. Hence, the time required to switch to the detuned state is about an order of magnitude less than the rise time of the transmit RF pulse. Hence, the switching circuit of the present invention will effectively detune the RF resonant circuit to avoid detrimental effects due to the transmit RF pulse.

The invention claimed is:

1. RF reception antenna device for receiving MR signals in a MR imaging system, the device comprising:
   a RF resonant circuit including a RF reception antenna for picking up the MR signals,
   a RF amplifier connected at its input to the RF resonant circuit for amplifying the picked up MR signals,
   a detection circuit configured to derive a switching signal from an output signal of the RF amplifier, and
   a switching circuit responsive to the switching signal, the switching circuit being configured to switch the RF resonant circuit between a resonant mode and a non-resonant mode.

2. RF reception antenna device according to claim 1, further comprising an analog-to-digital converter connected directly or indirectly to the output of the RF amplifier, wherein the detection circuit is configured to derive the switching signal from an output signal of the analog-to-digital converter.

3. RF reception antenna device according to claim 2, wherein the detection circuit is configured to derive the switching signal from an overflow signal of the analog-to-digital converter.

4. RF reception antenna device according to claim 2, wherein the detection circuit comprises a digital signal processor configured to derive the switching signal from the output signal of the analog-to-digital converter by means of digital signal processing.

5. RF reception antenna device according to claim 1, further comprising a comparator connected directly or indirectly to the output of the RF amplifier, wherein the detection circuit is configured to derive the switching signal from the output signal of the comparator.

6. RF reception antenna device according to claim 1, wherein the detection circuit is configured to derive the switching signal such that
the RF resonant circuit is switched to the off-resonant mode when the output signal of the RF amplifier exceeds a given transmit level, and
the RF resonant circuit is switched back from the off-resonant mode to the resonant mode when the output signal of the RF amplifier falls below a given receive level being lower than the transmit level.

7. RF reception antenna device according to claim 1, wherein the detection circuit is configured to derive the switching signal such that the RF resonant circuit is switched from the resonant mode to the off-resonant mode after expiration of a given time interval from the instant at which the output signal of the RF amplifier exceeds the transmit level.

8. RF reception antenna device according to claim 1, wherein the detection circuit is configured to derive the switching signal such that the RF resonant circuit is switched from the off-resonant mode to the resonant mode after expiration of a given time interval from the instant at which the resonant circuit is switched from the resonant mode to the off-resonant mode.

9. MR device comprising:
a main magnet for generating a uniform, steady magnetic field within an examination volume,
a number of gradient coils for generating switched magnetic field gradients in different spatial directions within the examination volume,
a volume RF coil for generating RF pulses within the examination volume during a transmit phase,
RF reception antenna device for receiving MR signals from a body of a patient positioned in the examination volume during a receive phase, the RF reception antenna device comprising:
a RF resonant circuit including a RF reception antenna for picking up the MR signals,
a RF amplifier connected at its input to the RF resonant circuit for amplifying the picked up MR signals,
a detection circuit configured to derive a switching signal from an output signal of the RF amplifier, and
a switching circuit responsive to the switching signal, the switching circuit being configured to switch the RF resonant circuit between a resonant mode in the receive phase and a non-resonant mode in the transmit phase,
a control unit for controlling the temporal succession of RF pulses and switched magnetic field gradients, and
a reconstruction unit for reconstruction of a MR image from the received MR signals.

10. MR device according to claim 9, wherein the RF reception antenna device is wirelessly connected.

* * * * *